United States Patent [19]
Dehaine et al.

[11] Patent Number: 5,801,449
[45] Date of Patent: Sep. 1, 1998

[54] PROCESS AND SUBSTRATE FOR CONNECTING AN INTEGRATED CIRCUIT TO ANOTHER SUBSTRATE BY MEANS OF BALLS

[75] Inventors: Gérard Dehaine, Châtillon; Yves Stricot, Les Clayes Sous Bois, both of France

[73] Assignee: Bull S.A., Louveciennes, France

[21] Appl. No.: 666,389

[22] PCT Filed: Dec. 14, 1995

[86] PCT No.: PCT/FR95/01670

§ 371 Date: Jun. 19, 1996

§ 102(e) Date: Jun. 19, 1996

[87] PCT Pub. No.: WO96/19013

PCT Pub. Date: Jun. 20, 1996

[30] Foreign Application Priority Data

Dec. 16, 1994 [FR] France ................... 94 15202

[51] Int. Cl.⁶ .................. H01L 23/48; H01L 23/52
[52] U.S. Cl. .................. 257/780; 257/781; 257/779
[58] Field of Search .................. 257/779, 780, 257/781, 782, 783, 787, 772

[56] References Cited

U.S. PATENT DOCUMENTS

| | | |
|---|---|---|
| 5,045,921 | 9/1991 | Lin et al. . |
| 5,127,570 | 7/1992 | Steitz et al. . |
| 5,203,075 | 4/1993 | Angulas et al. . |
| 5,559,316 | 9/1996 | Tomoda .................... 257/780 |
| 5,600,183 | 2/1997 | Gates et al. .............. 257/779 |
| 5,608,262 | 3/1997 | Degani et al. ........... 257/779 |
| 5,616,958 | 4/1997 | Laine et al. ............. 257/779 |

FOREIGN PATENT DOCUMENTS

| | | |
|---|---|---|
| 0011013 | 5/1980 | European Pat. Off. . |
| 0356300 | 2/1990 | European Pat. Off. . |
| 0527387 | 2/1993 | European Pat. Off. . |
| 1199439 | 8/1989 | Japan . |
| 6120296 | 4/1994 | Japan . |
| 864635 | 3/1996 | Japan . |

*Primary Examiner*—Mahshid D. Saadat
*Assistant Examiner*—S. V. Clark
*Attorney, Agent, or Firm*—Kerkam, Stowell, Kondracki & Clarke, P.C.; Edward J. Kondracki

[57] ABSTRACT

An integrated circuit (IC) package (10), having an integrated circuit (11) and a connecting substrate (12) comprising an insulating film (13), one side of which carries conductors (14) and the other side of which carries balls (15) connected to the respective conductors by means of via holes (16) in the film. The balls (15) are fixed directly to said via holes, the base of which is formed by the respective conductors. The balls are preferably made of a remeltable material such as tin lead and the fixation can be made initially by an adhesive substance. The process for connecting two connecting substrates (12, 22) by means of balls (15), one of which substrates comprises a film (13), one side of which is provided with conductors (14) and the other side of which is provided with via holes (16), consists of fixing the balls directly to the conductors in the via holes by remelting the balls. The balls can be soldered or prefixed by an adhesive substance to connecting pads (23) of a board (22).

18 Claims, 2 Drawing Sheets

PROCESS AND SUBSTRATE FOR CONNECTING AN INTEGRATED CIRCUIT TO ANOTHER SUBSTRATE BY MEANS OF BALLS

TECHNICAL FIELD OF THE INVENTION

The invention relates to a process and a substrate for connecting an integrated circuit to another substrate by means of balls. More specifically, the invention relates to a connecting substrate of an integrated circuit comprising an insulating film, one side of which carries conductors and the other side of which carries balls connected to the respective conductors by means of via holes recessed into the film. Another subject of the invention is an integrated circuit package. The invention advantageously applies to the technology of connection by means of an array of balls, commonly called BGA (Ball Grid Array) technology, and more specifically to that known as tape or TBGA (Tape BGA) technology.

DESCRIPTION OF RELATED ART

In the connecting substrate ordinarily used, via holes recessed into a film are metalized and each of them has a metalized ring on the side of the film opposite that which carries the conductors. A connecting ball is fixed to the ring. In order for the ball to be properly supported on the ring, the via hole has a section which is somewhat smaller than that of the ball. The drawback of this connection is that it necessitates the metalization of the via holes, which requires several operations and adds appreciably to the cost of manufacturing the substrate. On the other hand, the small section of the metalized via holes has a relatively high self-induction for the signals and a non-negligible resistance to the passage of the supply currents.

On the other hand, the side which carries the balls of a conventional substrate often carries a conductive metallic foil which serves as a ground plate. This foil is connected to the metalized edges of the via holes intended for the ground leads carried on the other side of the substrate. Of course, the foil is pierced with holes which surround the metalized edges of the other via holes so as to be electrically insulated from them and from the respective balls. However, it is necessary to prevent the solder of these balls from spreading, for example by leaking, to the edges of the holes of the ground foil. Such spreading would create a short-circuit, which would be difficult to repair and would require the substrate, or even the very costly package, to be removed. Moreover, it is also necessary to prevent the solder from spreading near the edges of the holes in the foil in order to eliminate any risk of short-circuit. In order to satisfy these requirements, the balls are made from a material which does not remelt, i.e., reflow, when they are mounted on the film and does not remelt when they are mounted on the board. For this reason, the balls basically retain their dimensions after soldering. There are still other reasons why non-reflow soldering balls are currently used.

However, the use of non-reflow soldering balls entails other drawbacks. In fact, these balls serve to fix the connecting substrate of the integrated circuit to another connecting substrate, such as a printed circuit board for interconnecting several integrated circuits. The balls are therefore connected to connecting pads disposed in coplanar fashion on one side of the board, in a mount known as a surface mount and commonly called CMS (components mounted on the surface) or SMT (Surface Mount Technology). The use of non-reflow soldering balls therefore requires that the connecting pads practically all be in the same plane in order to ensure effective, reliable contact with the respective balls. In other words, the use of non-remeltable balls requires the use of boards which have very strict margins of tolerance for flatness. Add to this limitation of the application of the conventional substrate to boards of this type the drawback of the sharply higher cost of these boards. Moreover, the balls must have very precise dimensions and they are mounted on a film which does not normally have proper flatness. It follows that the apexes of the balls have difficulty remaining within the margins of flatness required for an effective and reliable connection of the balls to the board. This has the consequence of considerably reducing the efficiency of the mounting of the substrate on the board.

SUMMARY OF THE INVENTION

One of the objects of the invention is to avoid metalizing the via holes of the insulating film of the connecting substrate.

Another object is to avoid the use of non-remeltable balls.

Another object is to minimize the problems of flatness between the substrate and the connecting board.

Yet another object is to lower the cost of manufacturing a connecting substrate.

Finally, another object is to make the process of connecting two substrates by means of balls more flexible by offering a choice between several variant embodiments, which allows proper adaptation of the process to each case.

The subject of the invention is a connecting substrate for an integrated circuit, comprising an insulating film, one side of which carries conductors and the other side of which carries balls connected to the respective conductors by means of via holes, characterized in that the balls are fixed directly into these via holes, whose base is formed by the respective conductors.

A corollary subject of the invention is an integrated circuit package, characterized in that the integrated circuit is fixed to the connecting substrate defined previously.

Another subject of the invention is a process for connecting two connecting substrates by means of balls, one of which substrates comprises a film, one side of which is provided with conductors and the other side of which is provided with via holes for connecting the balls to the conductors, characterized in that it consists of fixing the balls directly to the conductors in the via holes by remelting the balls.

Yet another corollary subject of the invention is a connecting substrate, such as a printed circuit board, which has a side carrying connecting pads to which balls of remeltable material for the implementation of the process are fixed.

BRIEF DESCRIPTION OF THE DRAWINGS

The characteristics and advantages of the invention appear in the description which follows, given by way of example in reference to the appended drawings.

In the drawings.

DESCRIPTION OF THE PREFERRED EMBODIMENTS

Figure 1:
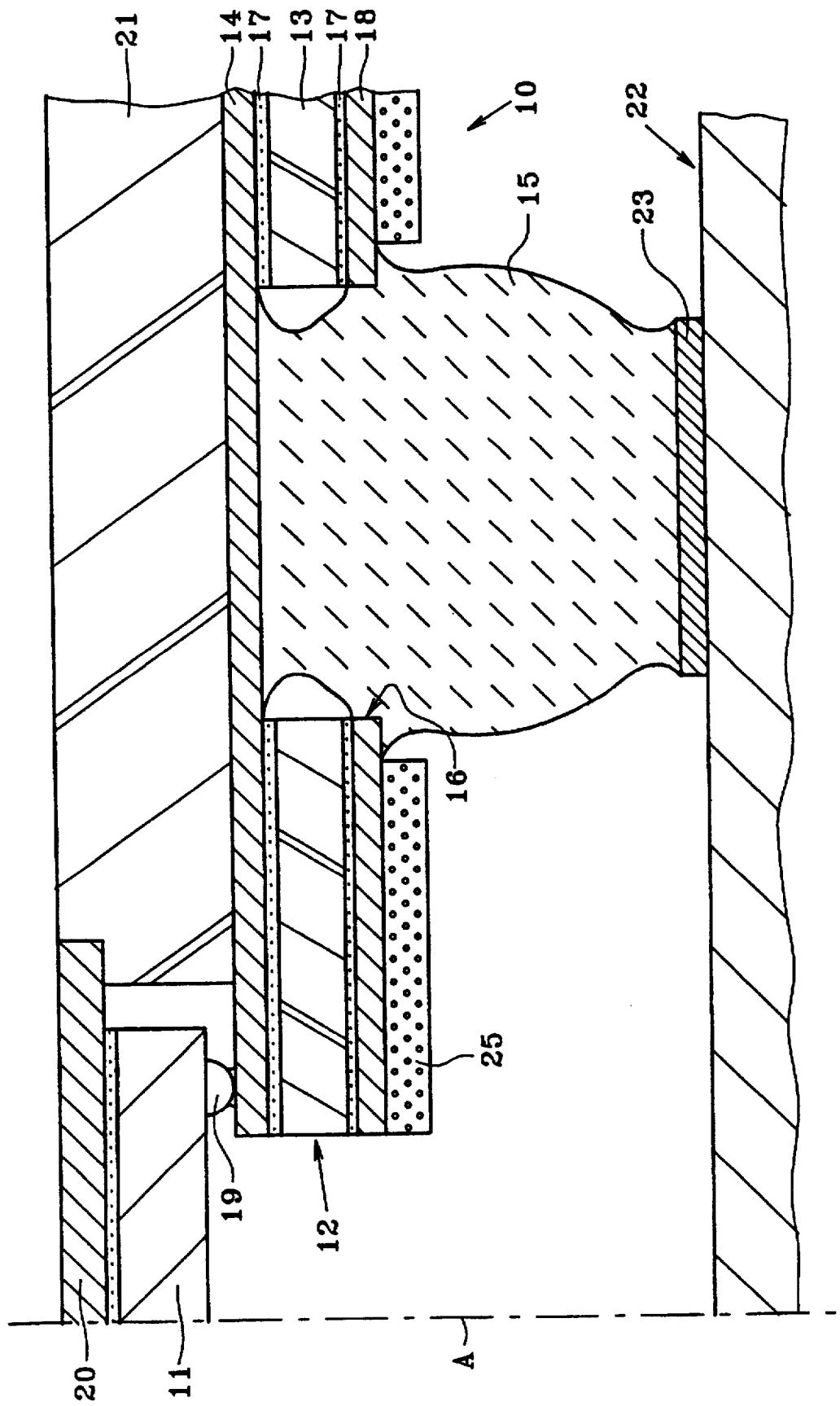
FIG. 1 is a schematic axial cutaway view limited to the central axis of an integrated circuit package fixed to a connecting substrate, which illustrates the connection process.

FIG. 1 illustrates a package 10 for an integrated circuit 11. The dimensions of the integrated circuit and the elements of the package as shown in the drawing have purposely been enlarged in order to make them stand out. The integrated circuit 11 is mounted on a connecting substrate 12. The substrate 12 illustrated is the conventional TAB (Tape-Automated Bonding) substrate or tape, and it comprises an insulating film 13, for example of polyimide, one side of which carries an array of conductors 14 and the other side of which carries balls 15. The conductors 14 form a beam which converges toward the central axis A indicated in the figure. The balls 15 are fixed directly into via holes 16 recessed into the film 13, the base of which is formed by the respective conductors 14. In the example illustrated, the substrate 13 is the type with three layers, namely a layer which constitutes the polyimide film 13, which ordinarily has a thickness between 75 and 125 µm, a conductive layer composed of the conductors 14, which usually has a thickness on the order of 20 to 35 µm, and an adhesive layer 17 with a thickness on the order of 25 µm. However, in the example produced by the inventors, the substrate 13 was the conventional two-layer type which avoids the use of the adhesive layer 17 and allows the use of a thinner film 13, typically on the order of 50 µm. The balls 15 usually have a diameter on the order of 600 to 700 µm and therefore have a ratio of 10 times the thickness of the film 13. The balls can be made of a non-reflow soldering material, requiring the use of a solder with a lower melting point (soft solder, for example) for their fixation to the conductors 14. Preferably, they are made of a material which allows reflow soldering. In practice, in the example illustrated, the balls 15 are made of reflow tin lead. Taking into account the size ratio between the balls and the film, the via holes 16 can have a section smaller than the diameter of the balls. However, if they are made of or reflow material, they can have almost the same size, since the reflow slightly smashes the balls into the via holes. This fact ensures good contact of the solder with practically all of the surface of the conductors 14, which are shaped so as to seal the via holes. In addition to this advantage, balls can be connected to a conductive plane 18, for example a ground plane, fixed to the film on its side carrying the balls, as indicated. The solder and/or the ball itself can come into contact with the edge of the plane 18 at the level of the via hole 16. However, in order to limit the spread of the solder on the conductive plane 18, it is possible for example to deposit a solder-resistant mask 25 on the conductive plane 18. This mask can be deposited by means of serigraphy, which does not constitute a costly operation. Optionally, the edges of the plane which must be connected to the balls could be slightly extended into the corresponding via holes, especially if the balls are made of a non-reflow soldering material. In order to avoid having the balls 15 come into contact with the conductive plane 18, it suffices to slightly separate the edges of the plane 18 around these balls.

The substrate according to the invention can also easily accommodate itself to various types of film and to any insulating material for its composition. For example, by using a thicker film 13, for example 200 µm thick, the via holes 16 would also offer the advantage of serving as a guide for the placement of the balls in the via holes and would thus play a self-positioning role. This role would also be advantageous for the placement and the soldering of non-remeltable balls 15.

In the package 10, the conductors 14 are fixed to the input-output terminals 19 of the integrated circuit 11. Although the terminals 19 illustrated are disposed on the periphery of the integrated circuit, it would also be possible to use the connection mode known as "flip-chip," which uses terminals 19 distributed along the entire side of the integrated circuit and connected directly to the conductors 14. Other techniques, of course, can also be implemented by the invention. For example, the fixation of the conductors 14 to the terminals 19 can be achieved by means of jumpers by the technique known as "wire bonding." In the package 10 illustrated, the opposite side of the integrated circuit 11 is placed in thermal contact with a thermal diffusion plate 20 supported by an insulating frame 21 which surrounds the integrated circuit 11. In the example illustrated, the frame 21 is fixed by adhesive bonding to the film 13 by its side which supports the wires 14.

In FIG. 1, the package 10 is fixed to a connection board 22 by means of balls 15. These balls are soldered to the respective connecting pads 23 on one side of the board 22. When reflow balls are used, the reflow of the balls offers a better flatness tolerance for the tops of the balls and, under the weight of the package, sharply increases the efficiency of the mounting on the board.

Generally, then, the subject of the invention is a connecting substrate 12 for an integrated circuit 11, comprising an insulating film 13, one side of which carries conductors 14 and the other side of which carries balls 15 fixed directly into via holes 16 of the film 13, the base of which is formed by the respective conductors, that is the conductors themselves or their extensions or enlargements. The conductors can partially close the respective via holes.

Even though the balls could be of the non-flow soldering-type, they are preferably made of a material which allows reflow soldering. For example, by using tin lead balls of nearly eutectic composition, remelting makes it possible to fix them to the conductors as well as to the connecting pads of a board and to accommodate them to all the boards on the market.

Figure 2:
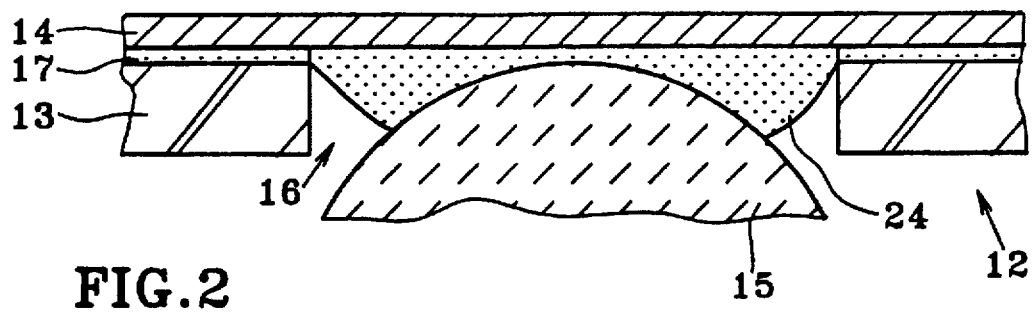
FIG. 2 is a partial cutaway view similar to that in FIG. 1, which illustrates a first variant embodiment of a connecting substrate for the package.
Figure 3:
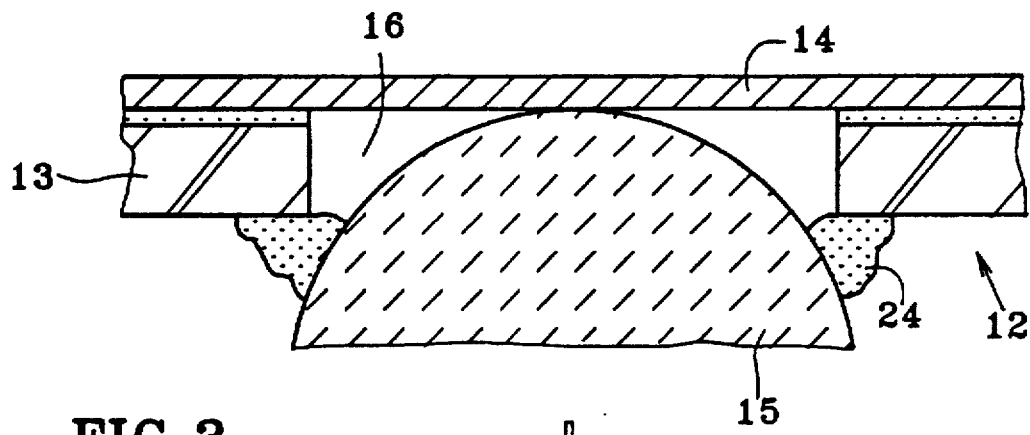
FIG. 3 is a partial schematic cutaway view similar to that in FIG. 3, which illustrates a second variant embodiment of a connecting substrate.

In the example illustrated in FIG. 1, the balls are fixed to the conductors by soldering. However, they could be fixed to the conductors 14 or to the substrate 12 by an adhesive substance. FIGS. 2 and 3 illustrate two examples of fixation by adhesive bonding, in which the elements in common with those in FIG. 1 are designated by the same reference numbers.

In FIG. 2, the conductor at the base of each via hole 16 is provided with an adhesive substance 24 in the form of a layer or a drop. Each ball is then placed so as to be fixed to the adhesive 24. When the balls are placed on the pads 23 of the board 22, the remelting of the balls takes place on each side of the balls and allows the fixation by soldering of the balls to the conductors 14 of the substrate 12 and to the pads 23 of the board 22. The adhesive 24 in this case will be a conductive, solderable adhesive. But the balls could also be fixed as indicated in FIG. 3, which is a variant of FIG. 2. In FIG. 3, each ball 15 is first placed in the via holes 16, then fixed by an adhesive 24 deposited on the outer surface of the substrate 12. Since FIGS. 2 and 3 are given only as examples, the substrate 12 illustrated has no conductive plane 18. However, it is clear that it could be added with no problem. If the balls are close to one another, the adhesive 24 would have to be insulating. However, it could be conductive, if they are far apart enough not to create a short-circuit or if it is desirable to interconnect some of them or to connect them to a conductive plane 18. Briefly, in the examples represented in FIGS. 2 and 3, the balls are made of a material which allows reflow soldering and are fixed by an adhesive substance. In FIG. 2, the balls are fixed to the conductors, while in FIG. 3 they are fixed to the other side of the substrate.

Figure 4:
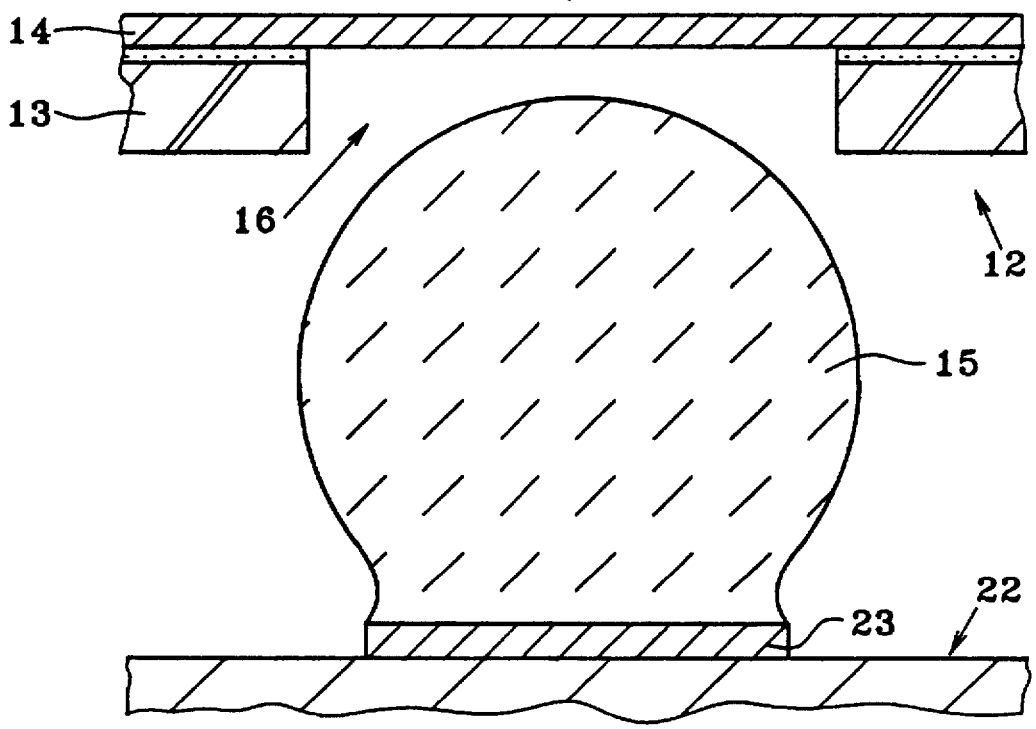
FIG. 4 is a partial schematic cutaway view similar to that in FIG. 1, which illustrates a variant embodiment of the connecting substrate for the package as well as a variant of the process for connecting two connecting substrates by means of balls.

In another example represented in FIG. 4, the balls 15 are first fixed by solder or by adhesive to the pads 23 of the board 22. The substrate 12 is only provided with via holes 16, with or without the conductive plane 18. In order to connect the connecting substrate 12 to the connection board 22 by means of balls 15, it suffices to position the remeltable balls 15 in the respective via holes and to remelt the balls so as to fix them to the conductors 14 and to the pads 23.

More generally, another subject of the invention is a process for connecting two connecting substrates 12, 22 by means of balls 15, one of which substrates comprises a film, one side of which is provided with conductors and the other side of which is provided with via holes for connecting the balls to the conductors, which process consists of fixing the balls directly to the conductors in the via holes by remelting the balls.

In FIG. 4, the balls are first fixed to the connecting pads of the other substrate 22.

Therefore, a corollary subject of the invention is a connecting substrate 22 such as a printed circuit board, which has a side which carries connecting pads 23 onto which balls of remeltable material for implementing the process are fixed. The balls can be fixed to the pads 23 by an adhesive substance 24 as indicated in FIG. 2 or 3. This case would allow the production of connection boards 22 provided with balls 15, which balls are later remelted during the mounting of the substrate 12 or the package 10.

In FIGS. 1 and 3, the balls are first fixed to the substrate 12 defined previously. It has been seen that in the case in FIG. 1, the balls may be made of a non-remeltable material. Thus, a corollary subject of the invention is a substrate which forms an integrated circuit package and which has input-output terminals in the form of balls fixed directly into the via holes of a film, with the base of the via holes being formed by the respective conductors of the package.

While this invention has been described in conjunction with specific embodiments thereof, it is evident that many alternatives, modifications and variations will be apparent to those skilled in the art. Accordingly, the preferred embodiments of the invention as set forth herein, are intended to be illustrative, not limiting. Various changes may be made without departing from the spirit and scope of the invention as set forth herein and defined in the claims.

We claim:

1. A substrate (12) for connecting to an integrated circuit (11), comprising an insulating film (13) having first and second sides opposite to each other, said first side of said insulating film having conductors (14), said conductors having first portions adapted to be connected to the integrated circuit and having second portions, said second side of said film having a conductive plane (18), and via holes (16) extending through said film and through said conductive plane to expose said second portions of said conductors, and balls (15) fixed directly in said via holes to the respective second portions of said conductors exposed in said via holes, said balls forming terminals of the substrate which are intended to be bonded to connection board means, and wherein said conductive plane is electrically connected to at least a first ball of said balls.

2. The substrate according to claim 1, wherein the balls are fixed to the second portions of said conductors by soldering.

3. The substrate according to claim 2, wherein the balls are comprised of a material which allows reflow soldering.

4. The substrate according to claim 1, wherein the balls are comprised of a material which allows reflow soldering and are fixed by an adhesive substance.

5. The substrate according to claim 1, wherein said electrical connection of said first ball is effected by providing a slight extension of an edge of said conductive plane into the via hole, at said via hole corresponding to said at least first ball, and wherein said extended edge contacts said at least first ball.

6. The substrate according to claim 1, wherein said balls include a reflow soldering material and said at least first ball is electrically connected to said conductive plane by said reflow solder material of said at least first ball when soldered to the conductors, said conductive plane having a solder resist material (25) disposed on a side of said conductive plane opposite said second side of said insulating film, to limit the spread of the reflow soldering material on said conductive plane.

7. The substrate according to claim 5, wherein said balls include a reflow soldering material and said at least first ball is electrically connected to said conductive plane by said reflow solder material of said at least first ball when soldered to the conductors, said conductive plane having a solder resist material (25) disposed on a side of said conductive plane opposite said second side of said insulating film, to limit the spread of the reflow soldering material on said conductive plane.

8. The substrate according to claim 5, wherein said at least one via hole has a ball positioned therein which is not to be electrically connected to the conductive plane, and wherein said conductive plane at said at least one via hole has an edge which is slightly separated from said ball positioned in said at least one via hole.

9. A substrate (12) for connecting to an integrated circuit (11), comprising an insulating film (13) having first and second sides opposite to each other, said first side of said insulating film having conductors (14), said conductors having first portions connected to the integrated circuit and having second portions, said second side of said insulating film having via holes (16) extending through said film to expose said second portions of said conductors, and balls (15) initially fixed to the substrate in said via holes to form terminals of the substrate prior to being connected to a connection board means (22), said balls being permanently fixed to the respective second portions of said conductors at the same time that the balls are bonded to said connection board means.

10. The substrate according to claim 9, wherein the balls are initially fixed to the second portions of the conductors by a conductive, solderable adhesive substance (24) and are permanently fixed to the conductors by soldering said adhesive substance.

11. The substrate according to claim 9, wherein the balls are solder balls initially fixed to said second side of said film by an adhesive substance (24) and are permanently fixed to the conductors by soldering.

12. The substrate according to claim 9, wherein said second side of said film has a conductive plane (18) fixed to said film and having via holes corresponding to and aligned with said via holes extending through said film, and wherein at least one of said balls is electrically connected to said conductive plane.

13. The substrate according to claim 12, wherein said electrical connection of said at least one ball is effected by providing a slight extension of an edge of said conductive plane into the via hole, said via hole corresponding to said at least one ball, and wherein said extended edge contacts said at least one ball.

14. The substrate according to claim 13, wherein said balls include a reflow soldering material and said conductive plane carries a solder resist material (25) to limit the spread of the reflow soldering material on said conductive plane when said balls are fixed to said conductors.

15. The substrate according to claim 12, wherein said at least one via hole has a ball positioned therein which is not to be electrically connected to the conductive plane, and wherein said conductive plane at said at least one via hole has an edge which is slightly separated from said ball positioned in said at least one via hole.

16. A connection board (22) for connection to at least one substrate (12) having terminals exposed through via holes, the connection board comprising a plate having a major surface, connecting pads (23) on said major surface, said connecting pads having surfaces facing respective ones of said terminals of said at least one substrate, and balls (15) for bonding said pads to said respective ones of said terminals, said balls being attached onto said surfaces of said pads and adapted to be fixed to respective terminals of said substrate when the balls are bonded to said connection board.

17. The connection board according to claim 16, wherein the balls are initially fixed by a conductive, solderable adhesive substance disposed on said surfaces of said pads and are permanently fixed to said surfaces of said pads by soldering said adhesive substance.

18. The connection board according to claim 16, wherein the balls are solder balls that are initially fixed by an adhesive substance to said pads on said major surface of the connection board and are permanently fixed to said surfaces of said pads by soldering said solder balls.

* * * * *